(12) United States Patent
Tanaka et al.

(10) Patent No.: US 8,274,049 B2
(45) Date of Patent: Sep. 25, 2012

(54) SAMPLE PROCESSING AND OBSERVING METHOD

(75) Inventors: Keiichi Tanaka, Chiba (JP); Yo Yamamoto, Chiba (JP); Xin Man, Chiba (JP); Junichi Tashiro, Chiba (JP); Toshiaki Fujii, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 13/065,238

(22) Filed: Mar. 17, 2011

(65) Prior Publication Data

US 2011/0226948 A1    Sep. 22, 2011

(30) Foreign Application Priority Data

Mar. 18, 2010 (JP) .................................. 2010-063337

(51) Int. Cl.
*H01L 21/66* (2006.01)
(52) U.S. Cl. ................ 250/311; 250/492.1; 250/492.21; 250/492.22; 250/310
(58) Field of Classification Search .................. 250/310, 250/311, 492.1, 492.21, 492.22
See application file for complete search history.

(56) References Cited

U.S. PATENT DOCUMENTS

| 6,042,736 | A * | 3/2000 | Chung | 216/33 |
| 6,194,720 | B1 * | 2/2001 | Li et al. | 250/311 |
| 6,251,782 | B1 * | 6/2001 | Lee et al. | 438/689 |
| 6,300,631 | B1 * | 10/2001 | Shofner | 250/311 |
| 6,927,174 | B2 * | 8/2005 | Anciso et al. | 438/712 |
| 6,927,391 | B2 * | 8/2005 | Tokuda et al. | 850/10 |
| 7,002,150 | B2 * | 2/2006 | Iwasaki et al. | 250/307 |
| 7,176,458 | B2 * | 2/2007 | Tomimatsu et al. | 250/306 |
| 7,268,356 | B2 * | 9/2007 | Shichi et al. | 250/492.21 |
| 7,276,691 | B2 * | 10/2007 | Kodama et al. | 250/309 |
| 7,297,944 | B2 * | 11/2007 | Kodama et al. | 250/304 |
| 7,550,750 | B2 * | 6/2009 | Tokuda et al. | 250/492.21 |
| 7,700,367 | B2 * | 4/2010 | Fujii | 436/174 |
| 7,700,931 | B2 * | 4/2010 | Shichi et al. | 250/492.21 |
| 7,718,981 | B2 * | 5/2010 | Takahashi et al. | 250/492.21 |
| 7,755,044 | B2 * | 7/2010 | Fujii et al. | 250/307 |
| 7,973,280 | B2 * | 7/2011 | Takahashi et al. | 250/307 |

OTHER PUBLICATIONS

Abstract, publication No. JP2001-141620, publication date May 25, 2001.

* cited by examiner

*Primary Examiner* — David A Vanore
(74) *Attorney, Agent, or Firm* — Adams & Wilks

(57) ABSTRACT

There is provided a sample processing and observing method including irradiating a focused ion beam to a sample to form an observed surface, irradiating an electron beam to the observed surface to form an observed image, removing the surface opposite to the observed surface of the sample, forming a lamella including the observed surface and obtaining a transmission observed image for the lamella.

7 Claims, 4 Drawing Sheets

SAMPLE PROCESSING AND OBSERVING METHOD

BACKGROUND OF THE INVENTION

1. Field of the Invention

The present invention relates to a cross-section process and observation of a sample using a focused ion beam.

2. Background Art

In the related art, as methods for processing and observing a cross-section of a sample such as a semiconductor or the like, a method using an FIB (Focused Ion Beam)-SEM (Scanning Electron Microscope) apparatus is widely known. By using the FIB-SEM apparatus, it is possible to observe a cross-section, which is processed using the focused ion beam, with the SEM.

In recent years, with the fineness of observed objects, there has been a demand for high-resolution observation. A technique is disclosed in which a sample is formed as a lamella using the FIB, and the lamella is observed using a TEM (Transmission Electron Microscope) (refer to JP-A-2001-141620)

According to this method, a sample can be observed with a high resolution at a desired position.

SUMMARY OF THE INVENTION

However, since the formed images are different in the TEM observation and in a secondary particle image observation such as the SEM observation even if the same object is observed, there is a case where matter which is not observed in the TEM observation can be observed in the secondary particle image observation, and vice versa. The TEM observation and the secondary particle image observation are performed for the same object, and two observed images are preferably analyzed. In the method in the related art, the TEM observation and the secondary particle image observation are performed by separate apparatuses, and thus it is often difficult for the apparatuses to perform observation at the same observed position.

An object of the present invention is to provide a sample processing and observing method which enables a secondary particle image observation and a TEM observation to be made at the same observed position.

The present invention provides the following means.

According to an embodiment of the present invention, there is provided a sample processing and observing method including an observed surface forming step of irradiating a focused ion beam to a sample in a direction substantially parallel to the observed surface so as to remove the surface of the sample and exposing the observed surface; an observed image obtaining step of irradiating a charged particle beam to the observed surface in a direction substantially perpendicular to the observed surface, detecting generated secondary charged particles, and forming an observed image; a lamella forming step of irradiating the focused ion beam to the sample in a direction substantially parallel to the observed surface, removing a surface opposite to the observed surface of the sample, and forming a lamella including the observed surface; and a transmission observed image obtaining step of irradiating the charged particle beam to the lamella in the direction substantially perpendicular to the observed surface, detecting transmitted charged particles which are transmitted through the lamella, and forming a transmission observed image. Thereby, it is possible to obtain the secondary charged particle image for the observed surface formed using the focused ion beam and to form a lamella of the sample such that the charged particle beam is transmitted through the sample in such an exposed state that the charged particle beam can be irradiated to the observed surface. Therefore, it is possible to irradiate the charged particle beam to the observed surface for which the observed image (the secondary charged particle image) is obtained and obtain a transmission observed image for the observed surface from the transmitted charged particle beam. Accordingly, since the observed image and the transmission observed image for the same observed surface can be obtained, a target object which is not observed from each image can be analyzed through the comparison of the images.

In the sample processing and observing method according to the embodiment of the present invention, in the transmission observed image obtaining step, it is preferable that the sample is fixed to a position of the sample at which the observed image is obtained, and the charged particle beam is irradiated to the observed surface in a direction substantially perpendicular to the observed surface. Thereby, the observed image and the transmission observed image can be smoothly obtained. In addition, since the sample is not moved, it is possible to obtain the observed image and the transmission observed image reliably at the same position.

In the sample processing and, observing method according to the embodiment of the present invention, the observed image obtaining step may include a surface removing step of irradiating the focused ion beam so as to form a cross-section by removing the surface of the sample; a cross-section observed image obtaining step of obtaining a cross-section observed image by irradiating the charged particle beam to the cross-section formed using the focused ion beam; and a cross-section forming step of forming the next cross-section by irradiating the focused ion beam to the cross-section so as to remove the cross-section. Here, the cross-section observed image obtaining step and the cross-section forming step may be repeatedly performed until the observed surface is exposed. Thereby, it is possible to form a cross-section using the focused ion beam and to finish forming a cross-section when a desired observed surface is exposed while the formed cross-section is confirmed. Therefore, it is possible to obtain the observed image and the transmission observed image by exposing a desired observed object inside the sample.

The sample processing and observing method according to the embodiment of the present invention may further include a lamella observed surface removing step of irradiating the focused ion beam such that the observed surface of the lamella for which the transmission observed image is obtained is removed and a cross-section is formed; a lamella cross-section observed image obtaining step of obtaining a cross-section observed image by irradiating the charged particle beam to the cross-section formed using the focused ion beam; a lamella cross-section forming step of forming the next cross-section by irradiating the focused ion beam to the cross-section so as to remove the cross-section; and obtaining a plurality of lamella cross-section images by repeatedly performing the lamella cross-section forming step and the lamella cross-section observed image obtaining step. Thereby, it is possible to obtain a plurality of cross-section observed images for the inside of the lamella for which the transmission observed image is obtained. Therefore, it is possible to compare and analyze the transmission observed image for the lamella and the secondary charged particle image for the inside of the lamella.

In the sample processing and observing method according to the embodiment of the present invention, a three-dimensional image for the lamella may be built based on the lamella cross-section images and information regarding the distance between the cross-sections. Thereby, it is possible to compare and analyze three-dimensional images of the transmission observed image for the lamella and the secondary charged particle image for the inside of the lamella.

According to the sample processing and observing method according to an embodiment of the present invention, a charged particle beam is irradiated to an observed surface formed using a focused ion beam so as to obtain an observed image, and a lamella is formed while the observed surface is maintained in order to allow transmission through the lamella, thereby performing a TEM observation and a secondary particle image observation at the same observed position.

DETAILED DESCRIPTION OF THE INVENTION

Hereinafter, a method for processing and observing a sample according to an embodiment of the present invention will be described.

(1) Sample Processing and Observing Apparatus

Figure 1:
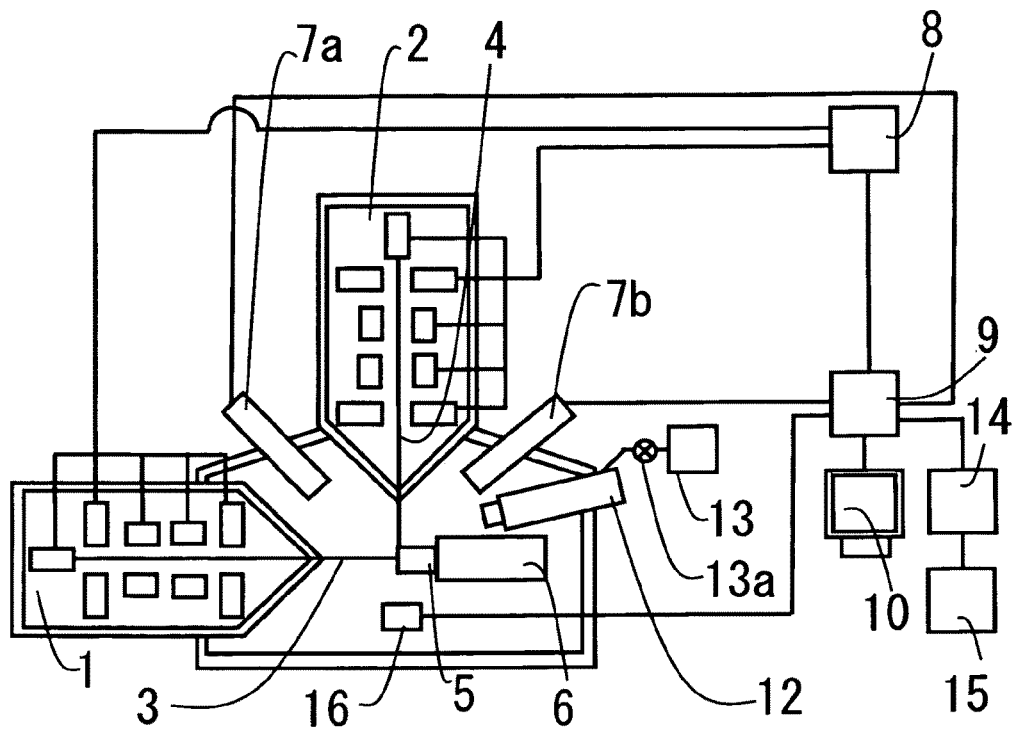
FIG. 1 is a configuration diagram illustrating a sample processing and observing apparatus according to an embodiment of the present invention.

The sample processing and observing apparatus includes a focused ion beam irradiation system 1, an electron beam irradiation system 2, and a sample stage 6, as shown in FIG. 1. The same region on a sample 5 placed on the sample stage 6 can be irradiated with a focused ion beam 3 emitted from the focused ion beam irradiation system 1 and an electron beam 4 emitted from the electron beam irradiation system 2. In addition, instead of the electron beam irradiation system 2, an ion beam irradiation system mounted with a gas field ion source may be used. In this case, as ion species, gases such as argon (Ar), helium (He), neon (Ne), krypton (Kr), xenon (Xe), hydrogen ($H_2$), oxygen ($O_2$), or nitrogen ($N_2$) may be used.

In addition, a secondary charged particle detector 7a which detects charged particles such as secondary electrons or secondary ions generated from the sample 5 is provided. A detection signal detected by the secondary charged particle detector 7a is transmitted to an image forming unit 9. In addition, a backscattered electron detector 7b is provided and can detect backscattered electrons which are backscattered from the electron beam 4. The backscattered electron detector 7b may be disposed inside the electron beam irradiation system 2. In addition, an X-ray detector 7c is provided and can detect X rays generated from the sample 5. Further, although not shown in the figure, a detector which detects particles of a material of the sample 5, generated from the sample 5, is provided and can obtain mass spectra.

The image forming unit 9 forms a secondary electron image, a secondary ion image, or a backscattered ion image based on a detection signal which is transmitted by the secondary charged particle detector 7a or the backscattered electron detector 7b, or an irradiation signal obtained by the focused ion beam irradiation system 1 or the electron beam irradiation system 2 scanning and emitting the focused ion beam 3 or the electron beam 4. The formed image is displayed on a display unit 10.

In addition, a raw gas is sprayed from a gas gun 12 to the sample 5, and a deposition film may be formed by irradiating a beam irradiation region with the focused ion beam 3 or the electron beam 4. The raw gas is contained in a gas source 13 and the supply of the gas is controlled by a valve 13a. Examples of the raw gas include a carbon-based gas such as phenanthrene or naphthalene, a metal compound gas containing platinum or tungsten, and the like. In addition, if an etching gas is used as the raw gas, a gas-assisted-etching can be performed for the beam irradiation region. The etching gas may use, for example, xenon fluoride, chlorine, iodine, chlorine trifluoride, fluorine monoxide, water, and the like.

(2) Perpendicularly Disposed Irradiation System

In addition, the focused ion beam irradiation system 1 and the electron beam irradiation system 2 are substantially perpendicular to each other at a position of the sample 5 placed on the sample stage 6. Regarding object lenses of the electron beam and ion beam irradiation systems, the object lens closer to a sample surface may emit a beam having a small beam diameter. For this reason, it is preferable that the irradiation system is disposed at a position close to the sample in order to perform high resolution observation or fine processing. However, since the front tips of the irradiation systems in the sample side typically have circular cones, the angle formed by the focused ion beam irradiation system 1 and the electron beam irradiation system 2 is small, and if the irradiation systems are disposed at positions close to the sample 5, the irradiation systems collide with each other. Therefore, the focused ion beam irradiation system 1 and the electron beam irradiation system 2 are disposed so as to be substantially perpendicular to each other, and thereby the irradiation systems do not collide with each other even if the irradiation systems are disposed at positions close to the sample 5.

In addition, for a cross-section of the sample 5 formed using the focused ion beam 3, the electron beam irradiation system 2 can scan and irradiate the cross-section with the electron beam 4 so as to be substantially perpendicular to the cross-section. The electron beam 4 is irradiated to the cross-section so as to be substantially perpendicular to the cross-section, and thereby it is possible to obtain a high resolution observed image. In addition, after the cross-section is formed using the focused ion beam 3, the cross-section is observed using the electron beam 4 without moving the sample stage 6, and thereby it is possible to greatly reduce the time taken for the cross-section processing and observing step in which the cross-section formation and the cross-section observation are repeated several times.

In addition, a transmitted electron detector 16 is provided in a direction where the electron beam 4 is emitted. The sample 5 is irradiated with the electron beam 4 which is accelerated at an accelerating voltage which enables the electron beam 4 to be transmitted through the sample 5, and transmitted electrons are detected by the transmitted electron detector 16. The image forming unit 9 can form a transmitted electron image based on a detection signal detected by the transmitted electron detector 16.

(3) Sample Processing and Observing Method

Figure 2A:
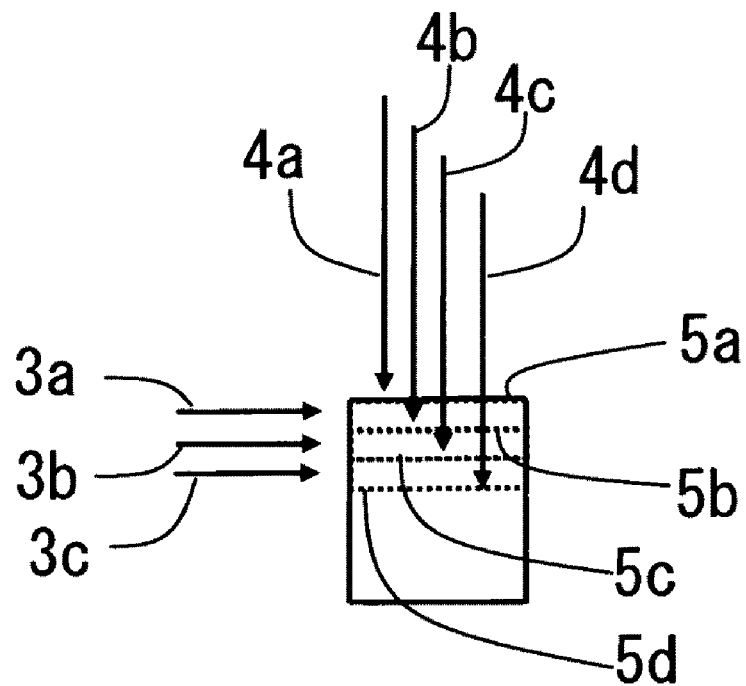
FIGS. 2A and 2B are schematic diagrams illustrating sample process and observation according to an embodiment of the present invention.
Figure 2B:
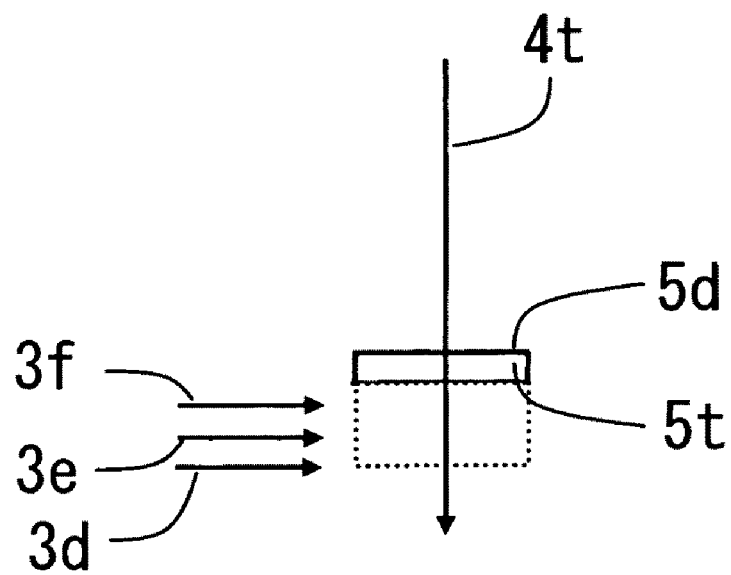
Figure 3:
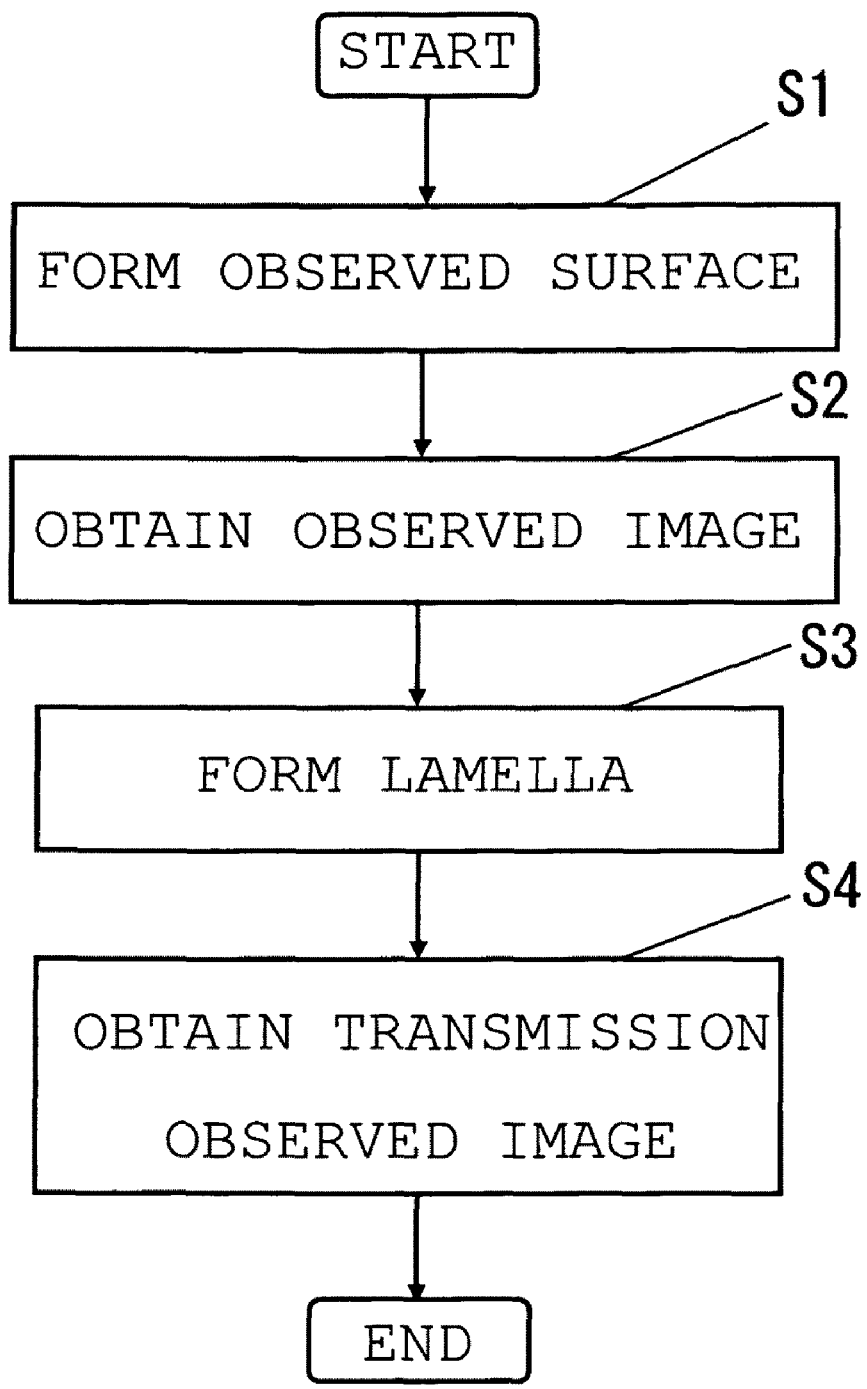
FIG. 3 is a flowchart illustrating sample process and observation according to the embodiment of the present invention.

Next, a sample processing and observing method will be described. FIGS. 2A and 2B are schematic diagrams illustrating a sample processing and observing method, and FIG. 3 is a flowchart. First, the surface of the sample 5, that is, the surface of the electron beam irradiation system 2 side of the sample 5 is removed to expose an observed surface (S1). At this time, the focused ion beam is irradiated in a direction substantially parallel to the observed surface so as to form the observed surface. Thereby, it is possible to form the observed surface substantially perpendicular to the electron beam 4. Next, the observed surface is irradiated with the electron beam 4 so as to obtain a secondary electron image for the observed surface (S2). At this time, the observed surface is irradiated substantially perpendicular to the electron beam, and thus it is possible to obtain a high resolution observed image.

In addition, in order to expose a desired observed surface inside the sample 5, as shown in FIG. 2A, a cross-section is formed using the focused ion beam 3, a secondary electron image is obtained by irradiating the electron beam 4 to the formed cross-section, further, the next cross-section is formed using the focused ion beam 3, and these steps are repeatedly performed. Also, a desired observed surface is confirmed to be exposed from the secondary electron image for the cross-section, and then the steps may finish. In other words, the focused ion beam 3a is irradiated to the sample surface 5a, and the electron beam 4b is irradiated to the formed cross-section 5b, thereby obtaining a secondary electron image for the cross-section 5b. If the cross-section 5b is not a desired observed surface, the focused ion beam 3b is irradiated again to remove the cross-section 5b. Then, the cross-section 5c is formed, and a secondary electron image for the cross-section 5c is obtained using the electron beam 4c. Further, the cross-section 5d is formed by irradiating the focused ion beam 3c. If the cross-section 5d is confirmed to be a desired observed surface from a secondary electron image for the cross-section 5d, the above-described cross-section forming steps finish. The determination of the desired observed surface may be made from luminance, contrast, or the shape of the secondary electron image.

Next, the sample 5 is processed to form a lamella so as to leave the cross-section 5d which is the observed surface for which the secondary electron image has been obtained (S3). As shown in FIG. 2B, the focused ion beams 3d, 3e, and 3f are irradiated to the sample 5 from a surface opposite to the cross-section 5d, thereby forming a lamella 5t. In this case, the focused ion beams 3d, 3e and 3f are sequentially irradiated such that the thickness of the sample 5 gradually decreases, the sample 5 is irradiated with the electron beam 4t during the process, and transmitted electrons may be detected by the transmitted electron detector 16. It is possible to determine the completion of the process using the focused ion beam while variation in the transmitted electron image is observed at this time.

Next, the electron beam 4t having energy for passing through the lamella 5t is irradiated thereto, and a transmitted electron image for the lamella 5t is obtained by detecting transmitted electrons using the transmitted electron detector 16 (S4). The transmitted electron image is obtained by scanning and irradiating the electron beam 4t in order to include the same region as the secondary electron image for the cross-section 5d. Thereby, it is possible to obtain the secondary electron image for the observed surface (the cross-section 5d) and the transmitted electron image for the lamella 5t including the observed surface (the cross-section 5d), and compare and analyze the images.

In addition, the images in the secondary electron image and the transmitted electron image have information different from each other. The secondary electron image mainly reflects information regarding the observed surface by using the electron beam 4 accelerated at a low accelerating voltage (for example, 100 to 1000 V). On the other hand, the transmitted electron image can obtain information regarding the inside of the lamella 5t as two-dimensional information of the transmitted electron image by using the electron beam 4t accelerated at an accelerating voltage (for example, 2 to 30 kV) which enables the electron beam 4t to be transmitted through the lamella 5t. Two pieces of information for the same observed surface can be obtained by such a method, and thereby the sample 5 can be analyzed from many directions. Particularly, while the secondary electron image and the transmitted electron image are obtained, it is preferable that the sample stage 6 is not moved. This is because there is a concern that there is a possibility that an observed position will be moved due to the movement of the sample stage 6, thus making it difficult to make a comparison between positional relationships in the two images different in image quality. For example, in a case where an alloy material is observed, in some cases, the alloy component is observed from the secondary electron image but is not observed from the transmitted electron image. If the secondary electron image and the transmitted electron image are obtained without the movement of the sample stage 6, it is possible to analyze at which position the alloy component observed from the secondary electron image is present in the transmitted electron image since the same observed position is maintained.

Figure 4A:
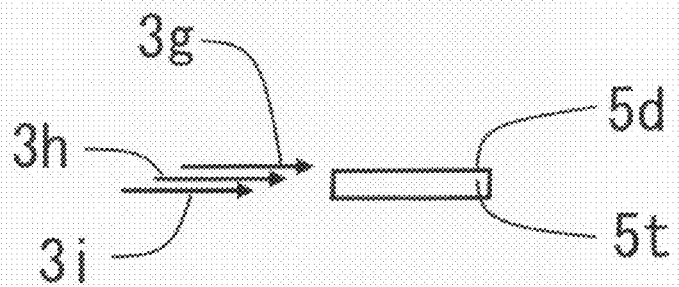
FIGS. 4A to 4C are schematic diagrams illustrating sample process and observation according to the embodiment of the present invention.

In addition, a cross-section of the lamella 5t for which the transmitted electron image is obtained may be processed and observed, and a plurality of secondary electron images for the inside of the lamella 5t may be obtained. As shown in FIG. 4A, a cross-section is formed by irradiating the focused ion beam 3g to the lamella 5t, and the formed cross-section is irradiated with the electron beam 4 so as to obtain a secondary electron image. In addition, the focused ion beam 3h and the focused ion beam 3i are irradiated to remove the cross-section and then to form the next cross-section, and an observed image for the formed cross-section is obtained. Thereby, a plurality of secondary electron images for the inside of the lamella 5t can be obtained. Therefore, it is possible to compare and analyze a plurality of secondary electron images for a region for which a transmitted electron image is actually obtained and the transmitted electron image.

(4) Three-Dimensional Image Building

Figure 4B:
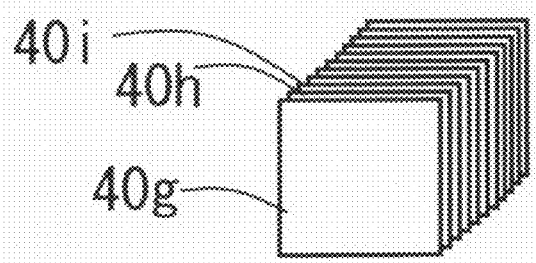
Figure 4C:
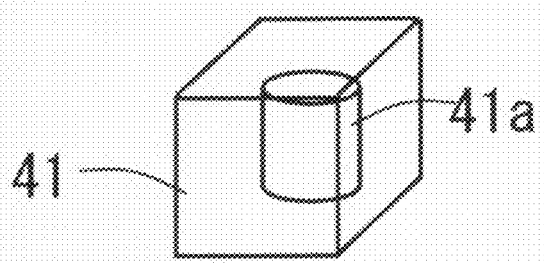

According to the above-described method, a plurality of cross-sections is formed on the lamella 5t, and observed images therefor are obtained. The obtained observed images and beam feeding width information is stored in an image storage unit 14. A three-dimensional forming unit 15 combines the plurality of observed images based on the stored observed images and the beam feeding width information and builds a 3D image which is displayed on the display unit 10. When the 3D image is built, as shown in FIG. 4B, the observed images for the cross-sections 40g, 40h, 40i, ..., as the scale of the image, are disposed such that the interval between the observed images becomes the same as the beam feeding width, and the image is processed such that the observed images become translucent. Thereby, as shown in FIG. 4C, a 3D image 41 can be built. In the 3D image 41, a structure 41a included in the region which undergoes the cross-section process and observation can be recognized in a stereoscopic manner. Therefore, it is possible to compare and analyze the 3D image based on a plurality of secondary electron images for a region for which a transmitted electron image is actually obtained and the transmitted electron image.

What is claimed is:

1. A sample processing and observing method comprising:
an observed surface forming step of irradiating a focused ion beam to the sample in a direction substantially parallel to an observed surface so as to remove a surface of the sample and exposing the observed surface;

an observed image obtaining step of irradiating a charged particle beam to the observed surface in a direction substantially perpendicular to the observed surface, detecting generated secondary charged particles, and forming an observed image;

a lamella forming step of irradiating the focused ion beam to the sample in a direction substantially parallel to the observed surface, removing a surface opposite to the observed surface of the sample, and forming a lamella including the observed surface; and a transmission observed image obtaining step of irradiating the charged particle beam to the lamella in the direction substantially perpendicular to the observed surface, detecting transmitted charged particles which are transmitted through the lamella, and forming a transmission observed image.

2. The sample processing and observing method according to claim 1, wherein in the transmission observed image obtaining step, the sample is fixed to a position of the sample at which the observed image is obtained, and the charged particle beam is irradiated to the observed surface in the direction substantially perpendicular to the observed surface.

3. The sample processing and observing method according to claim 1, wherein the observed image obtaining step includes:

a surface removing step of irradiating the focused ion beam so as to form a cross-section by removing a surface of the sample;

a cross-section observed image obtaining step of obtaining a cross-section observed image by irradiating the charged particle beam to the cross-section formed using the focused ion beam; and a cross-section forming step of forming a next cross-section by irradiating the focused ion beam to the cross-section so as to remove the cross-section, wherein the cross-section observed image obtaining step and the cross-section forming step are repeatedly performed until the observed surface is exposed.

4. The sample processing and observing method according to claim 1, further comprising:

a lamella observed surface removing step of irradiating the focused ion beam such that the observed surface of the lamella for which the transmission observed image is obtained is removed and a cross-section is formed;

a lamella cross-section observed image obtaining step of obtaining a cross-section observed image by irradiating the charged particle beam to the cross-section formed using the focused ion beam;

a lamella cross-section forming step of forming a next cross-section by irradiating the focused ion beam to the cross-section so as to remove the cross-section; and obtaining a plurality of lamella cross-section images by repeatedly performing the lamella cross-section forming step and the lamella cross-section observed image obtaining step.

5. The sample processing and observing method according to claim 4, wherein a three-dimensional image for the lamella is built based on the lamella cross-section images and information regarding a distance between the cross-sections.

6. The sample processing and observing method according to claim 1, wherein
the charged particle beam is an electron beam or a gas ion beam.

7. The sample processing and observing method according to claim 6, wherein the gas ion beam is a gas ion beam emitted from a gas field ion source.

* * * * *